United States Patent
Yamaguchi et al.

(10) Patent No.: US 8,208,054 B2
(45) Date of Patent: Jun. 26, 2012

(54) SOLID-STATE IMAGING DEVICE

(75) Inventors: Takumi Yamaguchi, Kyoto (JP); Sougo Ohta, Kyoto (JP)

(73) Assignee: Rosnes Corporation, Kyoto-shi (JP)

( * ) Notice: Subject to any disclaimer, the term of this patent is extended or adjusted under 35 U.S.C. 154(b) by 468 days.

(21) Appl. No.: 12/595,229

(22) PCT Filed: Apr. 16, 2008

(86) PCT No.: PCT/JP2008/057439
§ 371 (c)(1),
(2), (4) Date: Oct. 8, 2009

(87) PCT Pub. No.: WO2008/133146
PCT Pub. Date: Nov. 6, 2008

(65) Prior Publication Data
US 2010/0066877 A1      Mar. 18, 2010

(30) Foreign Application Priority Data
Apr. 18, 2007   (JP) .................................. 2007-108869

(51) Int. Cl.
*H04N 5/335*   (2011.01)
(52) U.S. Cl. ........ 348/300; 348/272; 348/275; 348/280; 348/281; 348/294; 348/301; 348/302

(58) Field of Classification Search .................. 348/272, 348/273, 275, 277, 278, 279, 280, 281, 294, 348/298, 300, 301, 302, 303, 304
See application file for complete search history.

(56) References Cited

U.S. PATENT DOCUMENTS

| | | | |
|---|---|---|---|
| 6,043,478 A | 3/2000 | Wang | |
| 7,902,618 B2 * | 3/2011 | Mao et al. | 257/431 |
| 2007/0030372 A1 * | 2/2007 | Inagaki et al. | 348/308 |
| 2007/0222885 A1 * | 9/2007 | Katsuno et al. | 348/340 |

FOREIGN PATENT DOCUMENTS

| | | | |
|---|---|---|---|
| JP | 2003-273342 A | 9/2003 |
| JP | 2004-215048 A | 7/2004 |
| JP | 2005-183527 A | 7/2005 |
| JP | 2005-198001 A | 7/2005 |
| JP | 2006-80937 A | 3/2006 |
| JP | 2006-303468 A | 11/2006 |

* cited by examiner

*Primary Examiner* — David L. Ometz
*Assistant Examiner* — Quang Le
(74) *Attorney, Agent, or Firm* — Marvin A. Motsenbocker; Mots Law, PLLC

(57) ABSTRACT

A solid state imaging device includes shared amplification transistors and reset transistors arranged, for example, in a checkered pattern so that centroid of photo diodes 2 of the same colors are arranged substantially at an identical pitch. As a result, the resolution of the solid state imaging device can be maintained without considering irregularities of the incident light for each unit pixel.

10 Claims, 9 Drawing Sheets

SOLID-STATE IMAGING DEVICE

TECHNICAL FIELD

The present invention relates to a solid-state imaging device, and particularly relates to a solid-state imaging device in which a plurality of pixels share one amplifier transistor and one reset transistor.

BACKGROUND ART

In recent years, there have been widely used video cameras and electronic cameras. Each of these cameras adopts a solid-state imaging device such as a CCD (Charge Coupled Device) or a CMOS (Complementary Metal Oxide Semiconductor) image sensor. Such a solid-state imaging device includes an imaging block in which a plurality of photoelectric conversion blocks each configured by a photodiode are disposed in a two-dimensional array, and there are formed unit regions (unit pixels) each including the photodiode as a main functional part.

In the CCD, a light beam incident on each unit pixel is photoelectric-converted by a photodiode into a signal charge, which is transferred to a floating diffusion (FD) block provided at an output block via a vertical CCD transfer register as well as via a horizontal CCD transfer register. Thereafter, with use of a MOS transistor, the CCD senses a variation in electric potential of the FD block and amplifies the sensed variation in electric potential so as to output as an imaging signal.

By the way, the CMOS image sensor includes in each unit pixel an FD block as well as various types of MOS transistors used for transfer, amplification, and the like, and accordingly does not need to transfer an electric charge. The CMOS image sensor is thus operable at a lower voltage in comparison to a CCD-type solid-state imaging device, and is suited to reduction in electric power consumption. The CMOS image sensor is also suited to reduction in size of the image sensor since complicated signal processing functions can be easily aggregated in one chip.

FIG. 12 is an explanatory view exemplifying a configuration of an imaging block of a conventional CMOS image sensor with an equivalent circuit for one unit pixel. In the CMOS image sensor shown in FIG. 12, each unit pixel 100 includes a photoelectric conversion block configured by a photodiode 102 and four MOS transistors 103 and 105 to 107 for converting a signal charge into a voltage signal and outputting the obtained voltage signal (see Patent Document 1 or the like).

During light receiving operation, signal charges (electrons) accumulated in the photodiode 102 are transferred to a floating diffusion (FD) block 104 through the electric charge transfer gate 103 in accordance with a readout pulse that is applied from a readout signal line 109 to a gate electrode of the electric charge transfer gate 103. The FD block 104 is connected to a gate electrode of the amplifier transistor 105, and a variation in electric potential of the FD block 104 due to the signal charges (electrons) is impedance-converted by the amplifier transistor 105 and is then outputted to a vertical signal line 15. The vertical select transistor 106 is switched ON and OFF in accordance with a vertical select pulse that is applied from a vertical select line 13 to a gate electrode thereof so as to drive the amplifier transistor 105 for a predetermined period of time. The reset transistor 107 resets the electric potential of the FD block 104 so as to be equal to the electric potential of a power supply line 108 in accordance with a vertical reset pulse that is applied from a vertical reset line 14 to the gate electrode thereof.

The unit pixels 100 are scanned as follows, one time each in one cycle by a vertical shift register 11 as well as by a horizontal shift register 12. Specifically, when vertical select pulses are outputted from the vertical shift register 11 to one vertical select line 13 during a constant period of time in one cycle, there are selected pixels in a row corresponding to this vertical select line 13, and output signals of the respective pixels are outputted to the corresponding vertical signal lines 15. During this constant period of time, horizontal select pulses are sequentially outputted from the horizontal shift register 12 to the respective horizontal select lines 17, and the output signals from the corresponding vertical signal lines 15 are sequentially extracted to horizontal signal lines 18 through the horizontal select transistors 16, respectively. Upon completion of scanning all the pixels in the same row, vertical select pulses are outputted to the vertical select line 13 in the following row so as to scan the respective pixels in the following row in the way similar to the above. These operations are repeated to scan all the pixels in all the rows one time each during one cycle, and there is performed time-series extraction of the output signals thereof to the respective horizontal signal lines 18.

FIG. 13 is a cross sectional view showing a configuration of the imaging block in the conventional CMOS image sensor. FIG. 14 is an explanatory view conceptually showing a relation of connection between the FD block 104 and peripheral impurity layers thereof, which cannot be fully shown in the cross sectional view of FIG. 13.

As shown in FIG. 13, there are formed in a surface layer of a silicon substrate 101 photodiodes 102 respectively embedded therein. Formed in the peripheries thereof is an n-type impurity layer that configures the MOS transistors inclusive of the electric charge transfer gates 103. As shown in FIG. 14, the n-type impurity layer configuring the embedded photodiode 102, the FD block 104, and the reset transistor 107 is provided and is electrically connected by a channel region below the gate electrode, thereby realizing effective transfer and elimination of a signal charge.

Leakage of a light beam into the circuit block including the MOS transistors causes photoelectric conversion, and a resultant electron generates an aliasing, which works as a noise.

There is formed a multilayer interconnection made of aluminum or the like above the silicon substrate 101 in an insulative layer 124 made of silicon oxide or the like. This multilayer interconnection includes a first layer of interconnection 121 which may be locally provided for connecting pixel transistors with each other, and a second layer of interconnection 122 as well as a third layer of interconnection 123, each of which may be provided in a wider area as a control signal line such as the vertical select line 13 for driving the transistors described above, a signal line such as the vertical signal line 15 for transmitting an electrical signal amplified by the amplifier transistor 105, a power supply line, or the like.

Further formed above the multilayer interconnection are a passivation film 125 made of silicon nitride or the like, a planarizing film, and the like, on top of which there are disposed a pixel color filter 126 and on-chip lenses 127. The on-chip lenses 127 are each used for condensing an incident light beam on the corresponding photodiode 102, and are generally provided at constant intervals so as to be equally spaced apart from one another.

In the above CMOS image sensor, the unit pixels 100 each have in common a relative positional relation among the photodiode 102, the MOS transistors 103 and 105 to 107, the in-pixel interconnection, and the on-chip lens 127. In other words, these respective members are disposed at constant intervals so as to be equally spaced apart from one another, thereby having same translational symmetry. As a result, a light beam is made incident on the photodiode 102 similarly in each of the unit pixels 100 so as to obtain an excellent image with less variations among the respective unit pixels 100.

An amplification-type solid-state image sensor such as a CMOS image sensor is required to include a multilayer interconnection of at least two layers, and desirably of three or more layers, as described above, which are formed on the photodiodes 102 with a large thickness. The difference in height between the surfaces of the photodiodes 102 and the third uppermost layer of interconnection may be 2 μm to 5 μm, which is substantially equal to one side of each of the pixels. A solid-state imaging device, which obtains an image by capturing a target subject with a lens, has a problem of large shading in a region close to the periphery of an imaged area, that is, interruption of an obliquely incident light beam by a light shielding film or by an interconnection, which reduces the quantity of light beams condensed on the photodiodes to result in significant deterioration in image quality.

In order to make such an obliquely incident light beam also condensed on a photodiode in the region close to the periphery of the imaged area, shading may be reduced by correcting the positions of the on-chip lens and the opening in the light shielding film, which is referred to as pupil correction. More specifically, the on-chip lens and the opening in the light shielding film are disposed in a direction along the incident light beam when seen from the photodiode. Patent Document 2 to be described later proposes a solid-state image sensor in which the position of a signal line (interconnection) relative to each unit pixel is deflected toward the center of an imaged area gradually from the center to the periphery of the imaged area.

In the present application, a unit region (unit pixel) indicates a region on a substrate provided with a portion for realizing a main function of one photodiode. Translational symmetry in an array of unit regions indicates regularity in the array that is obtained by collection of points each occupying a fixed position (such as a center) within unit regions equally sized.

In recent years, reduction in size of a solid-state image sensor has been required more for the purpose of mounting a camera function onto a mobile apparatus such as a mobile phone. Such reduction in size of the solid-state image sensor as well as reduction in size of each unit pixel for the purpose of increase in the number of pixels cause reduction in light receiving area in one unit pixel, which results in deterioration in properties of the solid-state image sensor such as the quantity of saturation signals and sensitivity.

In order to prevent such deterioration in properties, there has been conventionally adopted a countermeasure of reducing the area of transistors within a unit pixel so as to prevent reduction in area of a photodiode. However, it has been difficult to preferably maintain the properties of the solid-state image sensor with such a countermeasure.

Patent Document 1: Japanese Unexamined Patent Application No. 2006-303468
Patent Document 2: Japanese Unexamined Patent Application No. 2003-273342
Patent Document 3: Japanese Unexamined Patent Application No. 2005-198001
Patent Document 4: U.S. Pat. No. 6,043,478

DISCLOSURE OF THE INVENTION

Problems to be Solved by the Invention

Each of Patent Documents 3 and 4 proposes, as a breakthrough for the next generation, a CMOS image sensor in which a plurality of adjacent unit pixels share parts having been conventionally provided to each pixel, namely, an FD block, an amplifier transistor, a vertical select transistor, and a reset transistor, other than a photodiode and an electric charge transfer gate to be essential for each pixel.

This CMOS image sensor realizes reductions in the number of transistors and in the number of interconnections in one unit pixel, resulting in that the area for the photodiode is adequately secured. Also reduced is vignetting (hereinafter, vignetting indicates a phenomenon of interruption of a light beam by an obstacle placed in a path of the incident light beam) by the interconnection. This CMOS image sensor thus is useful for reduction in size of the unit pixel in some cases.

However, in the above case, the unit pixel mixedly includes a photodiode provided only for this pixel and a common region shared by a plurality of unit pixels. Since the relative position of the common region in one unit pixel is always different from that in another unit pixel adjacent thereto, the relative position of the photodiode in one unit pixel will be obviously different from that in the other unit pixel adjacent thereto. Therefore, unlike an ordinary CMOS image sensor according to a conventional art (see FIG. 13), the CMOS image sensor provided with such common regions cannot allow the photodiodes to be arranged at constant intervals so as to have translational symmetry same as that of the unit pixels. Below described with reference to the drawings are the above problem as well as problems arising in a case of providing onto such a substrate on-chip lenses each configured similarly to that according to the conventional art.

FIG. 15 is a cross sectional view showing a configuration of an imaging block of a CMOS image sensor provided with on-chip lenses 27 each configured similarly to that according to the conventional art on a silicon substrate 1 provided with photodiodes 2 and transistors described above. FIG. 15 mainly shows three unit pixels, with one FD block 4 shared at a boundary position 28 by a left unit pixel 10 and a central unit pixel 20, while a right unit pixel 30 and the central unit pixel 20 not sharing one FD block 4.

As described above, the n-type region of the photodiode 2 and the n-type region of the FD block 4 are electrically connected to each other via the channel region of an electric charge transfer gate 3 so that a signal charge can be efficiently transferred. The photodiodes 2 are thus each deflected so as to be away from the center of the FD block 4 as well as to be brought closer to a boundary position 29.

As a result, in the horizontal direction of FIG. 15, the photodiodes 2 in the respective unit pixels are arranged to alternately have a section with a long interval (between the adjacent unit pixels sharing one FD block 4) and a section with a short interval (between the adjacent unit pixels not sharing one FD block 4). Accordingly, the CMOS image sensor shown in FIG. 15 has the array different from that having translational symmetry at regular intervals in the ordinary CMOS image sensor, which is already described with reference to FIG. 13.

On the other hand, as shown in FIG. 15, there is formed on the silicon substrate 1 an insulative layer 24 made of silicon oxide or the like, in which a multilayer interconnection (inclusive of a first layer of interconnection 21, a second layer of interconnection 22, and a third layer of interconnection 23) is formed. The multilayer interconnection is arranged so as not to be positioned above the photodiodes 2 in order to allow as many as light beams to be incident on the photodiodes 2.

Formed above the multilayer interconnection are a passivation film 25 made of silicon nitride or the like, a planarizing film, and the like, on top of which there are disposed a pixel color filter 26 and the on-chip lenses 27.

As already described, the photodiodes 2 are each deflected, with respect to the center of the unit pixel, so as to be away from the center of the FD block 4 as well as to be brought closer to the boundary position 29. The multilayer interconnection is also deflected with respect to the center of the unit pixel so as not to be positioned above the photodiodes 2.

As a result of the above arrangement, light beams condensed by the on-chip lenses 27 are partially incident not on the corresponding photodiodes 2 but on the common regions provided with the transistors in the silicon substrate 1. There is also caused vignetting by the multilayer interconnection. Since the transistors in the common region and the multilayer interconnection are not uniformly arranged in each of the adjacent unit pixels, the problems described above cause variation in quantity of incident light beams among the different unit pixels as well as cause reduction in quantity of light beams incident on the photodiodes 2. Such variation in quantity of light beams incident on the photodiodes 2 among the different unit pixels results in inconstant sensitivities among the different unit pixels, which is not preferable as imaging property.

FIG. 16 is a plan view showing an ordinary layout in a case where one FD block 4 is provided so as to be shared by two unit pixels 10 and four adjacent pixels share one amplifier transistor 5, one vertical select transistor 6, and one reset transistor 7. The symbols R, B, Gr, and Gb indicated respectively in the photodiodes 2 denote colors in the Bayer Array. There are included the photodiodes 2 denoted by R for outputting red signals, the photodiodes 2 denoted by B for outputting blue signals, and the photodiodes 2 denoted by Gr or Gb for outputting green signals. The pixel color filter 26 shown in FIG. 15 divides these colors of R, B, Gr, and Gb. The symbol Gr denotes a green pixel provided next to a red pixel R, while the symbol Gb denotes a green pixel provided next to a blue pixel B.

In the cross section shown in FIG. 15, the floating diffusion (FD) block 4 is disposed between the two photodiodes 2 located on the dashed line A-A' of FIG. 16 as well as between the corresponding electric charge transfer gates 3 such that the shared FD block 4 is disposed between the two pixels vertically arrayed. A dotted line 51 specifies the four pixels that share one reset transistor, one vertical select transistor, and one amplifier transistor. There are provided in the center of the sharing pixels 51 the reset transistor 7, the vertical select transistor 6, and the amplifier transistor 5, which are shared by these four pixels.

FIG. 5 is an explanatory view exemplifying a configuration of an imaging block of a conventional CMOS image sensor with an equivalent circuit for four sharing pixels that share one amplifier transistor, one vertical select transistor, and one reset transistor.

FIG. 12 is a diagram of a circuit not to be shared, which has a principle of operation different from that of FIG. 5 only on the following points (1) to (2). Specifically, the differences are (1) there are four photodiodes 2, and (2) the sharing pixels 51 have four electric charge transfer gates 3 in total.

Regarding the already described problem of inconstant sensitivities among the different unit pixels, FIG. 16 shows a pixel interval A 61 and a pixel interval B 62, which establishes the relation expressed as: pixel interval A>pixel interval B. These pixels are not arranged at constant intervals, and thus the group in the row of pixels Gr and R has a quantity of incident light beams different from that of the group in the row of pixels B and Gb. As a result, there may be generated a horizontal stripe when the incident signals are converted into an image.

Generally performed as a countermeasure against the above problem is correction by signal processing. In a case where the sensitivities for the row of pixels B and Gb are lower than those for the row of pixels Gr and R, the sensitivities for the row of pixels B and Gb are multiplied by a certain coefficient so as to be corrected to be equal to the sensitivities for the row of pixels Gr and R.

With respect to the pixels Gr and Gb which are for the same color, a horizontal stripe is generated even by a slight difference between Gb and Gr. Accordingly, correction of Gr relative to Gb cannot be achieved by simple multiplication by a coefficient, and there is adopted a measure of correcting Gb by referring to a peripheral Gr. As the simplest measure for correction, the quantity of signals corresponding to the quantity of light beams incident on one Gr is determined by calculating an average value of this Gr and the lower right Gb, which is expressed as (Gr+Gb)/2, and the quantity of signals corresponding to the quantity of light beams incident on one Gb is determined by an average value of this Gb and the lower left Gr. Such averaging, however, causes deterioration in resolution. Accordingly, the resolution is deteriorated due to averaging upon sharing by a plurality of pixels for the purpose of reduction in size of the unit pixels (which allows improvement in resolution as a result) to be required by increase in the number of pixels. Such deterioration in resolution due to averaging is a result conflicting with the original purpose.

As described above, the technique for the sharing pixels, in which adjacent unit pixels in a CMOS image sensor share one amplifier transistor, one vertical select transistor, and one reset transistor, reduces the number of transistors provided in one unit pixel so as to adequately secure a light receiving area of a photodiode. However in this measure, the photodiode is provided at a position deflected from the center of the unit pixel. Accordingly, incident light beams cannot be effectively condensed on the photodiode with use of an on-chip lens having an optical axis arranged at the center of the unit pixel, resulting in remarkable variations in quantity of light beams among the photodiodes provided in the different unit pixels.

The present invention has been achieved in view of the above circumstances, and an object thereof is to provide a solid-state image sensor as well as an imaging device with the solid-state image sensor adopted therein, the solid-state image sensor capable of obtaining an image with no correction by signal processing that causes deterioration in resolution, even in a case where photodiodes are each deflected from a position of the array having translational symmetry.

Solution to the Problems

A first solid-state imaging device according to the present invention includes on a semiconductor substrate: a plurality of photodiodes, disposed in a matrix (i, j), for converting light beams into signal charges and accumulating the signal charges; an electric charge transfer gate for reading out the signal charges accumulated in the photodiodes; a floating diffusion for converting into electric potentials the signal charges that are photoelectric-converted by the photodiodes and are read out by the electric charge transfer gate; a reset transistor for resetting the signal charges; and an amplifier transistor for amplifying the read out signal charges, the reset transistor and the amplifier transistor being shared by the plurality of photodiodes, wherein one of the reset transistor and the amplifier transistor is disposed between a first photodiode (i, j) and a second photodiode (i, j+1) in a common region in which the reset transistor and the amplifier transistor are shared, and another one of the reset transistor and the amplifier transistor, not disposed between the first photodiode (i, j) and the second photodiode (i, j+1), is disposed between a third photodiode (i+1, j+n) and a fourth photodiode (i+1, j+n+1), while n being one of −1 and +1.

A solid-state imaging device according to a modification of the first solid-state imaging device of the present invention includes on a semiconductor substrate: a plurality of photodiodes, disposed in a matrix (i, j), for converting light beams into signal charges and accumulating the signal charges; an electric charge transfer gate for reading out the signal charges accumulated in the photodiodes; a floating diffusion for converting into electric potentials the signal charges that are photoelectric-converted by the photodiodes and are read out by the electric charge transfer gate; a reset transistor for resetting the signal charges; and an amplifier transistor for amplifying the read out signal charges, the plurality of photodiodes sharing the reset transistor and the amplifier transistor, wherein at least one of the reset transistor and the amplifier transistor is disposed in a clearance portion among the plurality of photodiodes sharing the reset transistor and the amplifier transistor, a distance between a centroid of a light sensing area of a first photodiode (i, j) included in the plurality of photodiodes and a centroid of a light sensing area of a second photodiode (i, j+1) included in the plurality of photodiodes is different from a distance between a centroid of a light sensing area of a photodiode (i+1, j) included in the plurality of photodiodes and a centroid of a light sensing area of a photodiode (i+1, j+1) included in the plurality of photodiodes, one of the reset transistor and the amplifier transistor is disposed between the first photodiode (i, j) and the second photodiode (i, i+1) both provided in a common region in which the reset transistor and the amplifier transistor are shared, and another one of the reset transistor and the amplifier transistor, not disposed between the first photodiode (i, j) and the second photodiode (i, j+1), is disposed between a third photodiode (i+n, j+1) and a fourth photodiode (i+1, j+n+1), while n being one of −1 and +1.

A second solid-state imaging device according to the present invention includes on a semiconductor substrate: a plurality of photodiodes, disposed in a matrix (i, j), for converting light beams into signal charges and accumulating the signal charges; an electric charge transfer gate for reading out the signal charges accumulated in the photodiodes; a floating diffusion for converting into electric potentials the signal charges that are photoelectric-converted by the photodiodes and are read out by the electric charge transfer gate; a reset transistor for resetting the signal charges; and an amplifier transistor for amplifying the read out signal charges, the reset transistor and the amplifier transistor being shared by the plurality of photodiodes, wherein one of the reset transistor and the amplifier transistor is disposed between a first photodiode (i, j) and a second photodiode (i+1, j) in a common region in which the reset transistor and the amplifier transistor are shared, another one of the reset transistor and the amplifier transistor, not disposed between the first photodiode (i, j) and the second photodiode (i+1, j), is disposed between a third photodiode (i+n, j+1) and a fourth photodiode (i+n+1, j+1), while n being one of −1 and +1.

A solid-state imaging device according to a modification of the second solid-state imaging device of the present invention includes on a semiconductor substrate: a plurality of photodiodes, disposed in a matrix (i, j) for converting light beams into signal charges and accumulating the signal charges: an electric charge transfer gate for reading out the signal charges accumulated in the photodiodes; a floating diffusion for converting into electric potentials the signal charges that are photoelectric-converted by the photodiodes and are read out by the electric charge transfer gate; a reset transistor for resetting the signal charges; and an amplifier transistor for amplifying the read out signal charges, the plurality of photodiodes sharing the reset transistor and the amplifier transistor, wherein at least one of the reset transistor and the amplifier transistor is disposed in a clearance portion among the plurality of photodiodes sharing the reset transistor and the amplifier transistor, a distance between a centroid of a light sensing area of a first photodiode (i, j) included in the plurality of photodiodes and a centroid of a light sensing area of a second photodiode (i+1, j) included in the plurality of photodiodes is different from a distance between a centroid of a light sensing area of a photodiode (i, j+1) included in the plurality of photodiodes and a centroid of a light sensing area of a photodiode (i+1, j+1) included in the plurality of photodiodes, one of the reset transistor and the amplifier transistor is disposed between the first photodiode (i, j) and the second photodiode (i+1, j) both provided in a common region in which the reset transistor and the amplifier transistor are shared, another one of the reset transistor and the amplifier transistor, not disposed between the first photodiode (i, j) and the second photodiode (i+1, j), is disposed between a third photodiode (i+n, j+1) and a fourth photodiode (i+n+1, j+1), while n being one of −1 and +1.

A third solid-state imaging device according to the present invention includes on a semiconductor substrate: a plurality of photodiodes, disposed in a matrix (i, j), for converting light beams into signal charges and accumulating the signal charges; an electric charge transfer gate for reading out the signal charges accumulated in the photodiodes; a floating diffusion for converting into electric potentials the signal charges that are photoelectric-converted by the photodiodes and are read out by the electric charge transfer gate; a reset transistor for resetting the signal charges; and an amplifier transistor for amplifying the read out signal charges, the plurality of photodiodes sharing the reset transistor and the amplifier transistor, wherein at least one of the reset transistor and the amplifier transistor is disposed in a clearance portion among the plurality of photodiodes sharing the reset transistor and the amplifier transistor, a distance between a centroid of a light sensing area of a photodiode (i, j) included in the plurality of photodiodes and a centroid of a light sensing area of a photodiode (i, j+1) included in the plurality of photodiodes is different from a distance between a centroid of a light sensing area of a photodiode (i+1, j) included in the plurality of photodiodes and a centroid of a light sensing area of a photodiode (i+1, j+1) included in the plurality of photodiodes, otherwise, a distance between the centroid of the light sensing area of the photodiode (i, j) included in the plurality of photodiodes and the centroid of the light sensing area of the photodiode (i+1, j) included in the plurality of photodiodes is different from a distance between the centroid of the light sensing area of the photodiode (i, j+1) included in the plurality of photodiodes and the centroid of the light sensing area of the photodiode (i+1, j+1) included in the plurality of photodiodes, two adjacent and paired photodiodes, included in the photodiodes, share the floating diffusion, and a plurality of floating diffusions each configured identically with the shared floating diffusion are disposed every other row in a row direction and every other column in a column direction so as to form a checkered pattern. A fourth solid-state imaging device according to the present invention includes on a semiconductor substrate: a plurality of photodiodes, disposed in a matrix (i, j), for converting light beams into signal charges and accumulating the signal charges; an electric charge transfer gate for reading out the signal charges accumulated in the photodiodes: a floating diffusion for converting into electric potentials the signal charges that are photoelectric-converted by the photodiodes and are read out by the electric charge transfer gate: a reset transistor for resetting the signal charges; and an amplifier transistor for amplifying the read out signal charges, the plurality of photodiodes sharing the reset transistor and the amplifier transistor, wherein at least one of the reset transistor and the amplifier transistor is disposed in a clearance portion among the plurality of photodiodes sharing the reset transistor and the amplifier transistor, a distance between a centroid of a light sensing area of a photodiode (i, j) included in the plurality of photodiodes and a centroid of a light sensing area of a photodiode (i, j+1) included in the plurality of photodiodes is different from a distance between a centroid of a light sensing area of a photodiode (i+1, j) included in the plurality of photodiodes and a centroid of a light sensing area of a photodiode (i+1, j+1) included in the plurality of photodiodes, otherwise, a distance between the centroid of the light sensing area of the photodiode (i, j) included in the plurality of photodiodes and the centroid of the light sensing area of the photodiode (i+1, j) included in the plurality of photodiodes is different from a distance between the centroid of the light sensing area of the photodiode (i, j+1) included in the plurality of photodiodes and the centroid of the light sensing area of the photodiode (i+1, j+1) included in the plurality of photodiodes, color filters are disposed such that the photodiode (i, j), the photodiode (i, j+1), the photodiode (i+1, j), and the photodiode (i+1, j+1) photoelectric-convert a light beam of a first color, a light beam of a second color, a light beam of a third color, and a light beam of the first color, respectively, centroids of light sensing areas of the photodiodes each for photoelectric-converting a light beam of the first color are arranged at substantially regular intervals along a row direction and a column direction, and centroids of light sensing areas of the photodiodes each for photoelectric-converting a light beam of one of the second and third colors are arranged at substantially regular intervals along the row direction and the column direction.

According to the present invention, in the photodiodes for photoelectric-converting corresponding green, blue, and red light beams with use of the color filters arranged in the Bayer Array, although the distance between the centroid of the photodiode for green and the centroid of the photodiode for red is different from the distance between the centroid of the photodiode for green and the centroid of the photodiode for blue, the centroids of the photodiodes for a same color are disposed to be equally spaced apart from each other. It is therefore possible to realize reduction in size of the unit pixels for the purpose of increase in the number of pixels, with no deterioration in resolution thereof.

BEST MODE FOR CARRYING OUT THE INVENTION

Below described in detail are embodiments of the present invention with reference to the drawings.

First Embodiment

Figure 1:
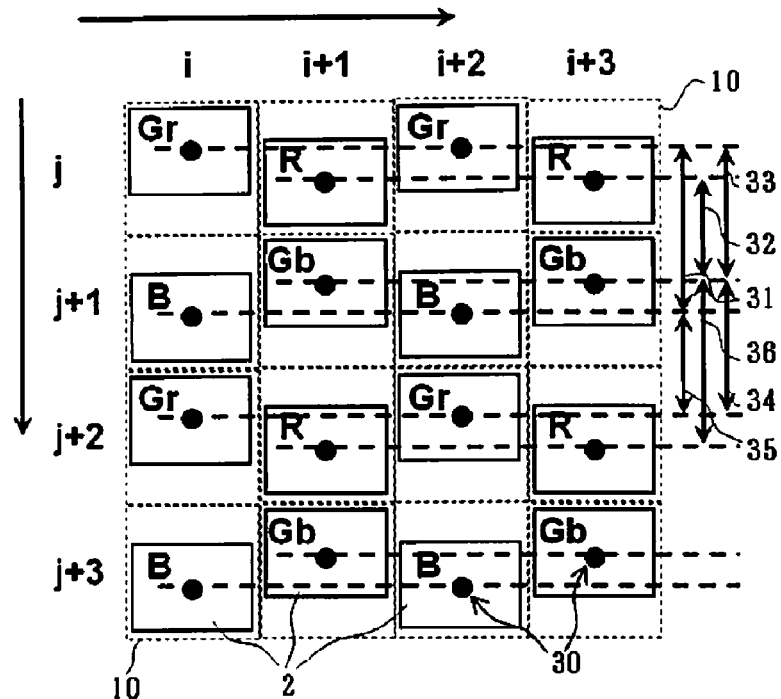
FIG. 1 is a diagram showing a layout of an imaging block in a CMOS image sensor according to a first embodiment.

FIG. 1 is a schematic diagram showing a configuration of a pixel array and arrangement of photodiodes, as a drawing for best indicating the features according to a first embodiment.

Shown in FIG. 1 are 16 unit pixels 10 in total which are arranged to have four pixels of i, i+1, i+2, and i+3 in a row direction and four pixels of j, j+1, j+2, and j+3 in a column direction, and photodiodes 2 for performing photoelectric-conversion are disposed respectively in these pixels. Each of the unit pixels 10 indicates a region on a substrate provided with a portion for realizing a main function of a photodiode. Each of the photodiodes 2 is denoted by one of symbols B, R, Gr, and Gb. More specifically, a B photodiode is provided with a blue color filter so as to photoelectric-convert a blue light beam. Similarly, an R photodiode and a Gr or Gb photodiode photoelectric-convert a red light beam and a green light beam, respectively. As shown in the drawing, a Gr photodiode is disposed next to an R photodiode, while a Gb photodiode is disposed next to a B photodiode. Each of the photodiodes 2 has a centroid 30 that corresponds to the point of intersection by diagonals of a quadrangular photodiode, as defined in the present application. Generally, the distance between two centroids (hereinafter, also referred to as a centroid distance) indicates a width across corner between two different points. In FIG. 1 according to the present embodiment, the distance between two centroids corresponds to the distance in the column direction as the photodiodes are arranged at regular intervals in the row direction.

Figure 15:
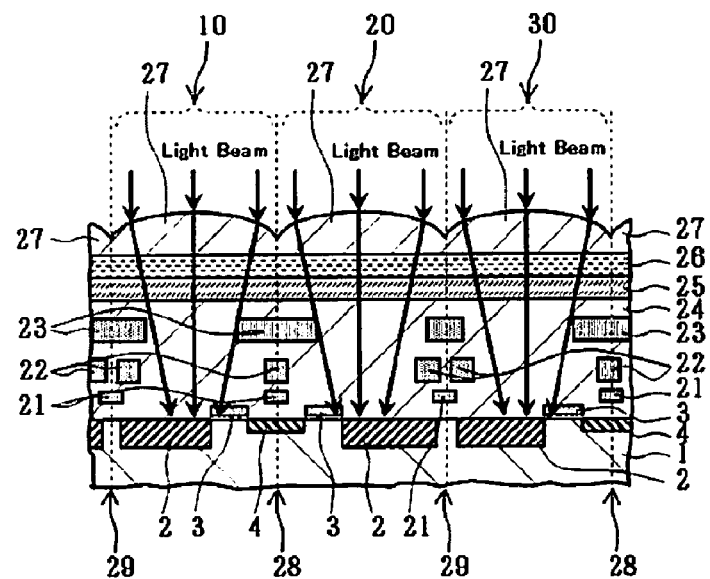
FIG. 15 is a cross sectional view exemplifying a configuration of an imaging block in the conventional CMOS image sensor provided with common regions.
Figure 16:
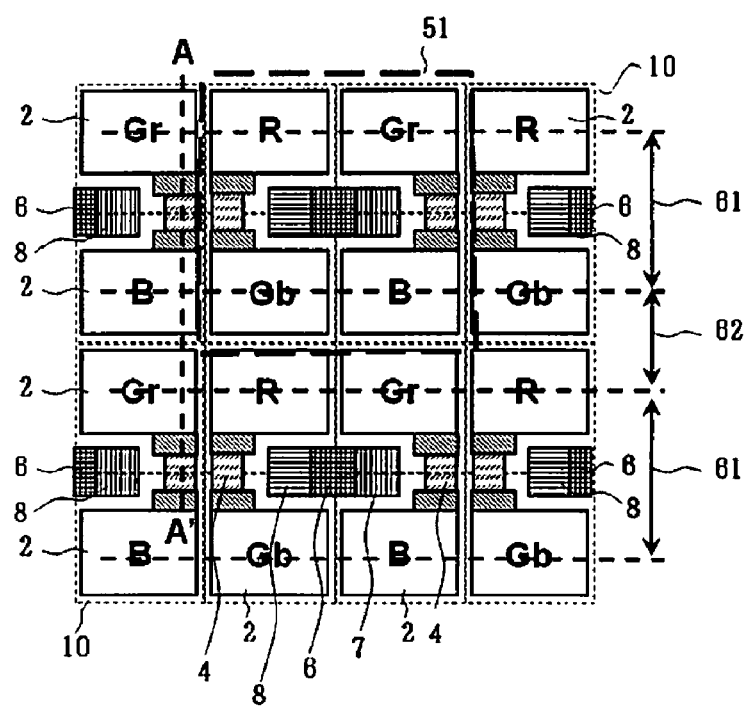
FIG. 16 is a diagram showing a layout of the imaging block in the conventional CMOS image sensor provided with the common regions.

As already described with reference to FIG. 15, in the column i, a centroid distance 31 between the Gr photodiode in the row j and the B photodiode in the row j+1 is different from a centroid distance 35 between the B photodiode in the row j+1 and the Gr photodiode in the row j+2. Therefore, the Gr photodiode in the row j has a sensitivity for the quantity of incident light beams, which is different from the sensitivity of the B photodiode in the row j+1.

The photodiodes in the column i+1 are arranged similarly to those in the column i. Accordingly, a centroid distance 32 between the R photodiode in the row j and the Gb photodiode in the row j+1 is different from a centroid distance 36 between the Gb photodiode in the row j+1 and the R photodiode in the row j+2. Therefore, the R photodiode in the row j has a sensitivity for the quantity of incident light beams, which is different from the sensitivity of the Gb photodiode in the row j+1.

Subsequently described are the centroids of the photodiodes each provided with a color filter for photoelectric-conversion of a green light beam. FIG. 1 shows a centroid distance 33 between the Gr photodiode in the row j and the Gb photodiode in the row j+1, as well as a centroid distance 34 between the Gb photodiode in the row j+1 and the Gr photodiode in the row j+2.

Figure 2:
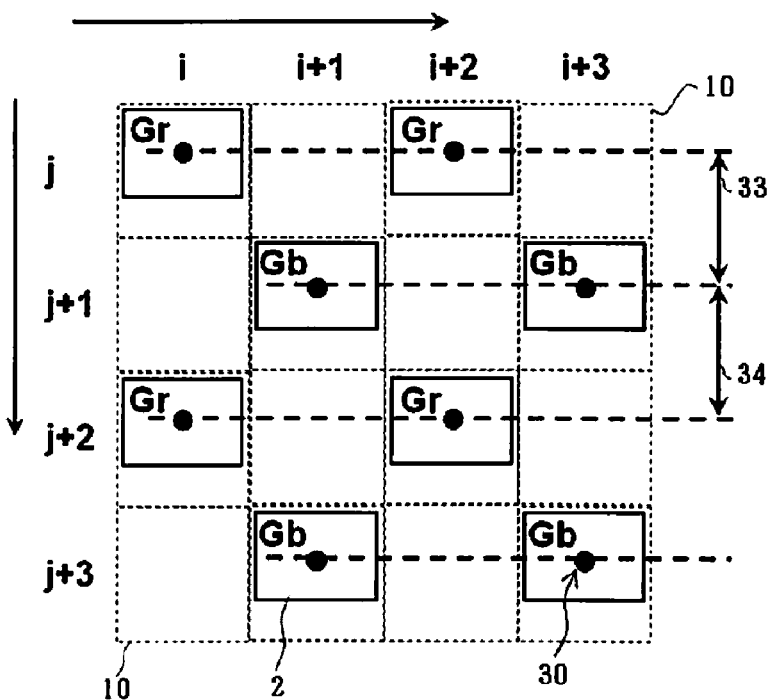
FIG. 2 is a diagram showing a layout of photodiodes for green in the imaging block of the CMOS image sensor according to the first embodiment.

For the sake of simplicity, FIG. 2 shows only the photodiodes each provided with a color filter for photoelectric-conversion of a green light beam. FIG. 2 is different from FIG. 1 only in that the photodiodes for processing red and blue light beams are not shown therein.

According to FIG. 2, the centroid distance 33 between the Gr photodiode in the row j and the Gb photodiode in the row j+1 and the centroid distance 34 between the Gb photodiode in the row j+1 and the Gr photodiode in the row j+2 are arranged at regular intervals. There is thus caused no optical deflection, which has been described as a problem, among the photodiodes each provided with a color filter for photoelectric-conversion of a green light beam, and the light beams are uniformly incident on these photodiodes. As a result, there is generated no horizontal stripe when an image is obtained from the incident signals. In a case where a green image is formed with use of signals at a subsequent stage, which are obtained from the Gr and Gb signals, the Gr photodiodes and the Gb photodiodes need to be arranged at regular intervals. Similarly, the R photodiodes need to be arranged at regular intervals in order to obtain a uniform image in red, while the B photodiodes need to be arranged at regular intervals in order to obtain a uniform image in blue.

Figure 3:
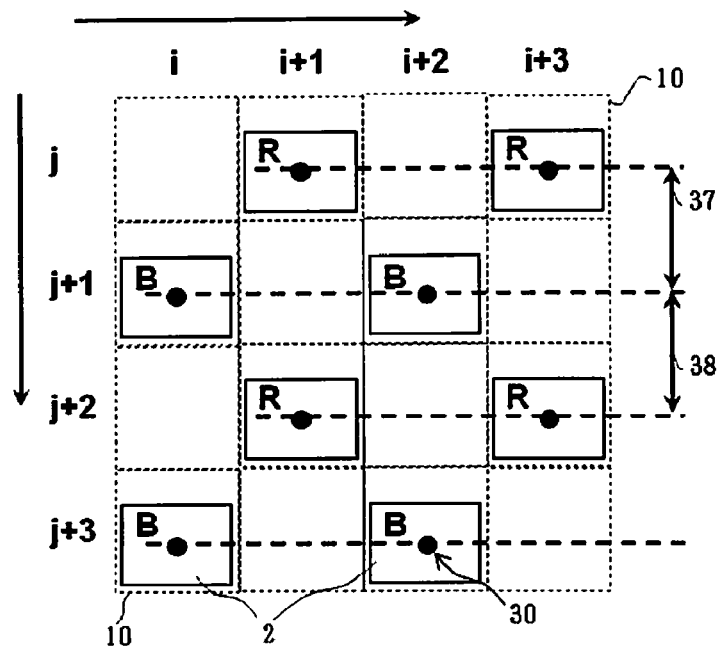
FIG. 3 is a diagram showing a layout of photodiodes for red and blue in the imaging block of the CMOS image sensor according to the first embodiment.

As in the illustration of FIG. 2, FIG. 3 shows only the photodiodes each provided with a color filter for photoelectric-conversion of a red or blue light beam.

According to FIG. 3, a centroid distance 37 between the R photodiode in the row j and the B photodiode in the row j+1 and a centroid distance 38 between the B photodiode in the row j+1 and the R photodiode in the row j+2 are arranged at regular intervals. There is thus generated no optical deflection, which has been described above as a problem, among the photodiodes each provided with a color filter for photoelectric-conversion of a red or blue light beam, and the light beams are uniformly incident on these photodiodes. As a result, there is generated no horizontal stripe when an image is obtained from the incident signals.

As described above, among the photodiodes provided correspondingly with color filters that are arranged in the Bayer Array, the photodiodes for a same color are arranged at regular intervals while the photodiodes for green and the photodiodes for red or blue are arranged at intervals different from each other.

Figure 4:
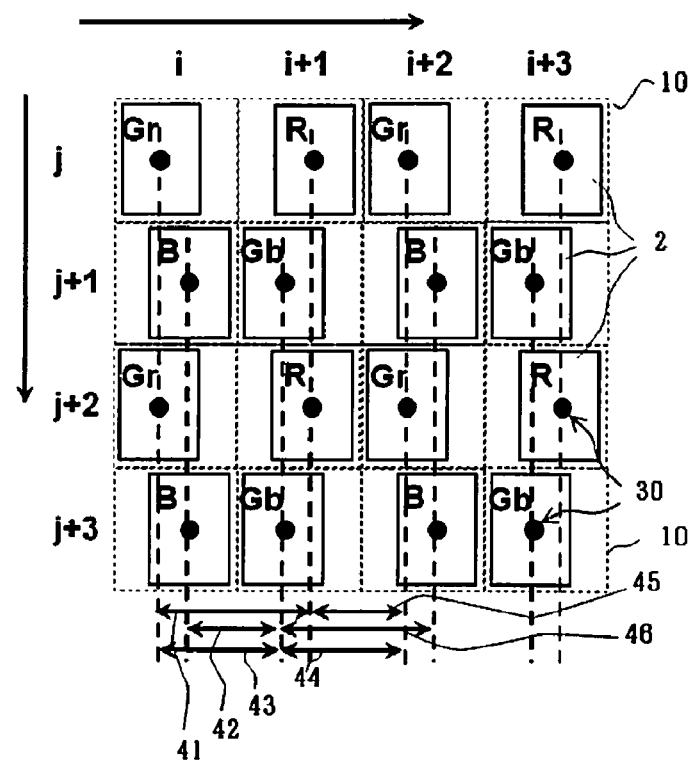
FIG. 4 is another diagram showing the layout of the imaging block in the CMOS image sensor according to the first embodiment.

Hereinbefore described with reference to FIG. 1 is the case where the centroids of the photodiodes for green and the centroids of the photodiodes for red or blue are arranged at intervals different from each other in the column direction. Next described with reference to FIG. 4 is a case where these photodiodes are arranged at intervals different from each other in the row direction.

There are shown the 16 unit pixels 10 in total which are arranged to have four pixels of i, i+1, i+2, and i+3 in the row direction and four pixels of j, j+1, j+2, and j+3 in the column direction, and the photodiodes 2 for performing photoelectric-conversion are disposed respectively in these pixels. Each of the photodiodes 2 is denoted by one of symbols B, R, Gr, and Gb. More specifically, a B photodiode is provided with a blue color filter so as to photoelectric-convert a blue light beam. Similarly, an R photodiode and a Gr or Gb photodiode photoelectric-convert a red light beam and a green light beam, respectively. As shown in the drawing, a Gr photodiode is disposed next to an R photodiode, while a Gb photodiode is disposed next to a B photodiode. FIG. 4 also shows the centroids 30 of the respective photodiodes 2.

As already described with reference to FIG. 15, in the row j, a centroid distance 41 between the Gr photodiode in the column i and the R photodiode in the column i+1 is different from a centroid distance 45 between the R photodiode in the column i+1 and the Gr photodiode in the column i+2. Therefore, the Gr photodiode in the column i has a sensitivity for the quantity of incident light beams, which is different from the sensitivity of the R photodiode in the column i+1.

The photodiodes in the row j+1 are arranged similarly to those in the row j. Accordingly, a centroid distance 42 between the B photodiode in the column i and the Gb photodiode in the column 41 is different from a centroid distance 46 between the Gb photodiode in the column i+1 and the B photodiode in the column i+2. Therefore, the B photodiode in the column i has a sensitivity for the quantity of incident light beams, which is different from the sensitivity of the Gb photodiode in the column i+1.

Subsequently described are the centroids of the photodiodes each provided with a color filter for photoelectric-conversion of a green light beam. FIG. 4 shows a centroid distance 43 between the Gr photodiode in the column i and the Gr photodiode in the column i+1, as well as a centroid distance 44 between the Gb photodiode in the column i+1 and the Gr photodiode in the column i+2.

In FIG. 4, as in the description with reference to FIG. 1, the centroid distance 43 between the Gr photodiode in the column i and the Gr photodiode in the column i+1 is equal to the centroid distance 44 between the Gb photodiode in the column i+1 and the Gr photodiode in the column i+2. As the photodiodes for green are arranged at regular intervals, there is caused no optical deflection, which has been described above as a problem, and the light beams are uniformly incident on these photodiodes. As a result, there is generated no horizontal stripe when an image is obtained from the incident signals.

Similarly, as for the photodiodes for red and blue, there is caused no optical deflection, which has been described above as a problem, so that the light beams are uniformly incident on the corresponding photodiodes. As a result, there is generated no horizontal stripe when an image is obtained from the incident signals.

In each of FIGS. 1 and 4, the Gr photodiode is disposed at the position (i, j), and the color filters are arranged in the Bayer Array with this Gr photodiode serving as an origin. This origin may be assigned to any one of the B photodiodes, the R photodiodes, the Gr photodiodes, and the Gb photodiodes, in any of which cases there are exerted the effects substantially the same as those of the present invention.

In FIG. 1, comparing the centroid distance 31 between the Gr photodiode in the row j and the B photodiode in the row j+1 with the centroid distance 35 between the B photodiode in the row j+1 and the Gr photodiode in the row j+2, the centroid distance 31 between the Gr photodiode in the row j and the B photodiode in the row j+1 is longer than the centroid distance 35. Accordingly, there is obtained a more efficient image sensor by provision, between the photodiodes arranged at the longer interval, of a reset transistor, an amplifier transistor, and a vertical select transistor, which are necessary to configure an image sensor.

The present invention may be also applied with a solid-state imaging device adopting a color filter in a complementary color (cyan, yellow, or magenta), in place of that in one of primary colors (green, red, and blue) arranged in the Bayer Array.

Figure 17:
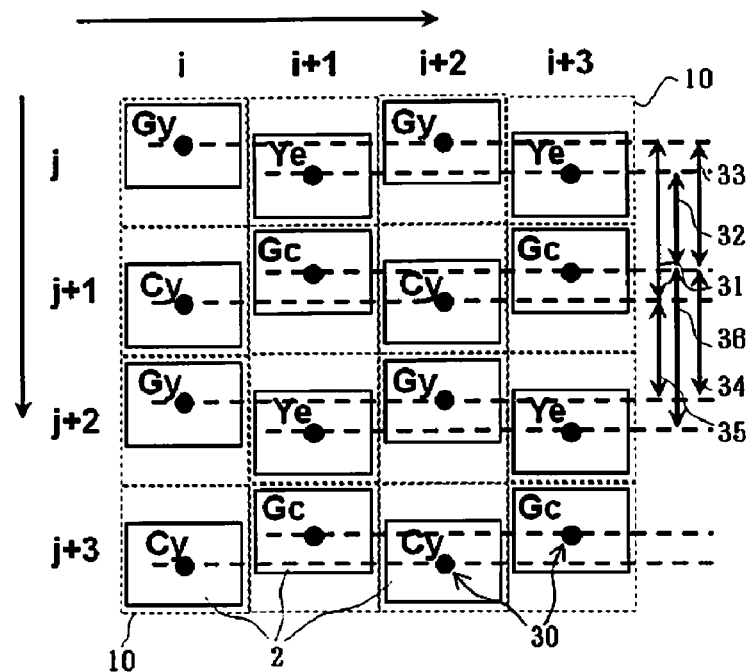
FIG. 17 is a diagram showing another layout of the imaging block in the CMOS image sensor according to the first embodiment.
Figure 18:
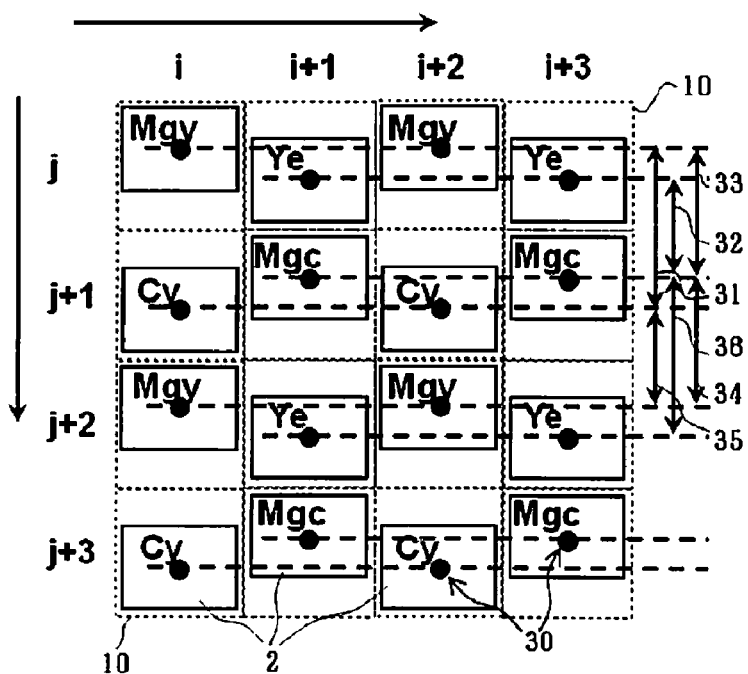
FIG. 18 is a diagram showing still another layout of the imaging block in the CMOS image sensor according to the first embodiment.

FIGS. 17 and 18 each exemplify a case of adopting a color filter in one of the complementary colors. FIG. 17 shows a case of adopting the primary color of green as well as the complementary colors of yellow and cyan, with (Gy) denoting a green color filter disposed next to a yellow (Ye) color filter and (Gc) denoting a green color filter disposed next to a cyan color filter. FIG. 18 shows a case of adopting the color filters in the complementary colors of yellow, cyan, and magenta, with (Mgy) denoting a magenta color filter disposed next to a yellow (Ye) color filter and (Mgc) denoting a magenta color filter disposed next to a cyan color filter. In both of these cases, there are exerted technical effects similar to those according to the Bayer Array.

Second Embodiment

The second embodiment is described next is.

As described in the first embodiment, among the photodiodes for green, red, and blue, which are provided respectively with the color filters in the Bayer Array, the photodiodes for a same color are arranged at regular intervals while the interval between a photodiode for green and a photodiode for red is different from the interval between a photodiode for green and a photodiode for blue. The second embodiment refers to arrangements of a reset transistor, an amplifier transistor, and a vertical select transistor, as well as a sharing method thereof in a case where these respective transistors are shared by a plurality of photodiodes.

Figure 5:
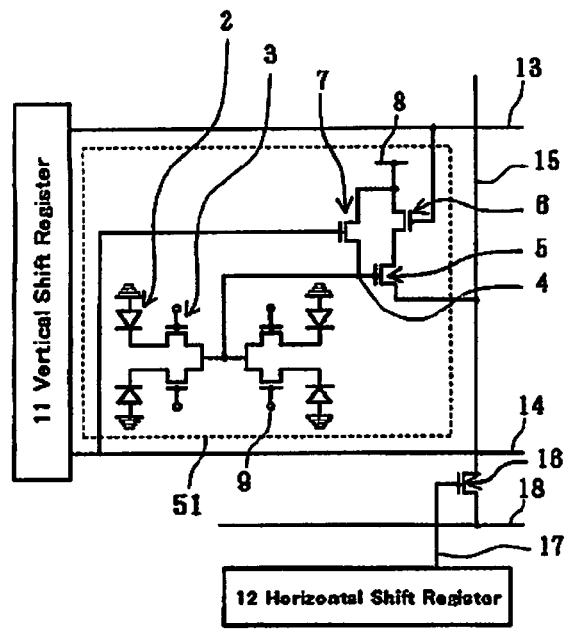
FIG. 5 is an explanatory view exemplifying a configuration of a CMOS image sensor with an equivalent circuit for one unit pixel according to a second embodiment.
Figure 12:
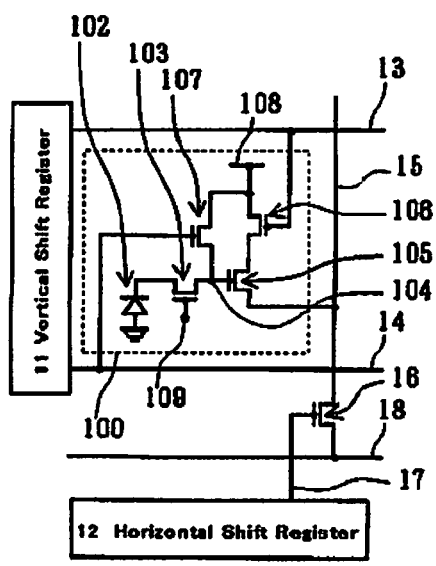
FIG. 12 is an explanatory view exemplifying a configuration of an imaging block in a conventional CMOS image sensor with an equivalent circuit for one unit pixel.
Figure 13:
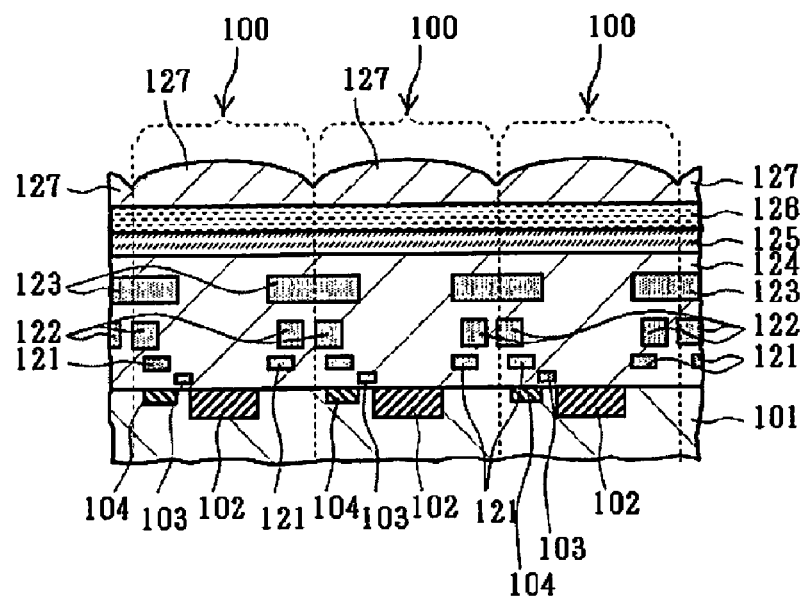
FIG. 13 is a cross sectional view showing a configuration of unit pixels in the conventional CMOS image sensor.
Figure 14:
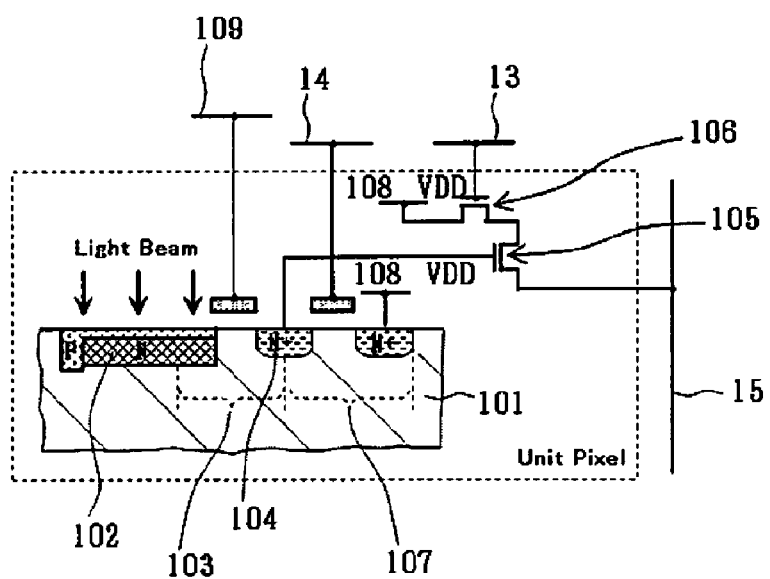
FIG. 14 is a cross sectional view showing the configuration of the unit pixel in the conventional CMOS image sensor.

FIG. 5 is an explanatory view of an equivalent circuit for four unit pixels that share transistors in an imaging block of a CMOS image sensor according to the second embodiment. The configuration of the imaging block in this CMOS image sensor is basically similar to that of the imaging block in the conventional CMOS image sensor, as already described with reference to FIG. 12. However, the configuration according to the present embodiment is different from the conventional configuration in that a common FD block 4 is provided for the four photodiodes 2 as well as in that one amplifier transistor 5, one vertical select transistor 6, and one reset transistor 7 are shared by these four photodiodes 2. As described with reference to FIG. 12, the photodiodes 2 are connected respectively to the FD block 4 through corresponding electric charge transfer gates 3.

During light receiving operation, the sharing pixels 51 are scanned as follows one time each in one cycle by a vertical shift register as well as by a horizontal shift register. Specifically, after vertical select pulses are outputted from the vertical shift register to one vertical select line 13 during a constant period of time in one cycle, there is selected one set of four the unit pixels 51 corresponding to this vertical select line 13. In this case, signal charges (electrons) accumulated in the photodiode 2 in each of the unit pixels 10 are sequentially transferred to the floating diffusion (FD) block 4 through the corresponding electric charge transfer gate 3 in accordance with a readout pulse that is applied from a readout signal line 9 to a gate electrode of the electric charge transfer gate 3. Thereafter, a variation in electric potential of the FD block 4 due to the signal charges (electrons) is converted by the amplifier transistor 5 into a voltage signal, which is then outputted to a vertical signal line 15.

During the above constant period of time, horizontal select pulses are sequentially outputted from the horizontal shift register to the respective horizontal select lines 17. Thereafter, the output signals from the corresponding vertical signal lines 15 are sequentially extracted to the horizontal signal lines 18 through the corresponding horizontal select transistors 16. Upon completion of scanning all the pixels in one row, vertical select pulses are outputted to the vertical select line 13 in the following row. As a result, the respective pixels in this following row are scanned similarly as described above. These operations are repeated to scan all the pixels in all the rows one time each during one cycle, and then performed is time-series extraction of the output signals thereof to the horizontal signal lines 18.

The vertical select transistor 6 is switched ON and OFF in accordance with a vertical select pulse that is applied from the vertical select line 13 to a gate electrode thereof so as to drive the amplifier transistor 5 for a predetermined period of time. The reset transistor 7 resets the electric potential of the FD block 4 so as to be equal to the electric potential of a power supply line 8 in accordance with a vertical reset pulse that is applied from a vertical reset line 14 to the gate electrode thereof.

As described above, in the CMOS image sensor serving as a solid-state image sensor according to the second embodiment, four photodiodes 2 share one amplifier transistor 5, one vertical select transistor 6, and one reset transistor 7, thereby reducing the number of transistors in one the sharing pixels 51. Accordingly reduced is the area on the substrate required for the output operation. As a result, the CMOS image sensor can be reduced in size or can be increased in the number of pixels. It is also possible to prevent reduction in light receiving area in each of the pixels that is caused by the reduction in size or the increase in the number of pixels in the CMOS image sensor.

Figure 6:
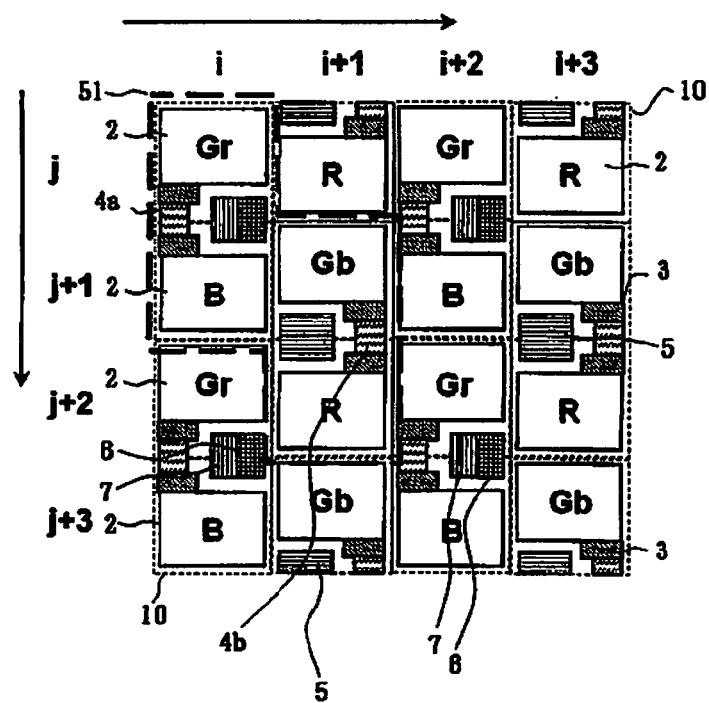
FIG. 6 is a diagram showing a layout of an imaging block in the CMOS image sensor according to the second embodiment, in which one reset transistor, one vertical select transistor, and one amplifier transistor are shared by four photodiodes.

FIG. 6 is a diagram showing a layout of the photodiodes 2 provided correspondingly with color filters that are disposed in the Bayer Array, the reset transistors 7, the vertical select transistors 6, the amplifier transistor 5, the electric charge transfer gates 3, and the floating diffusion (FD) blocks 4.

As described in the first embodiment, the Gr photodiodes and the Gb photodiodes both for green are arranged at regular intervals, and the R photodiodes for red and the B photodiodes for blue are also arranged at regular intervals. Further, the Gr photodiodes and the Gb photodiodes both for green are arranged at the intervals, which are different from the intervals for the R photodiodes for red and the B photodiodes for blue.

In one unit cell inclusive of four sharing photodiodes according to the present embodiment as indicated by the dashed line 51 in FIG. 6, the four photodiodes 2, namely, the Gr photodiode, the Gb photodiode, the R photodiode, and the B photodiode are arranged in the Bayer Array. Disposed between the Gr photodiode (i, j) and the B photodiode (i, j+1) are the electric charge transfer gates 3 for transferring electric charges that are photoelectric-converted by these respective photodiodes, and these electric charge transfer gates 3 are disposed symmetric with respect to a floating diffusion 4a.

Disposed between the Gb photodiode (i+1, j+1) and the R photodiode (i+1, j+2) are the electric charge transfer gates 3 for transferring electric charges that are photoelectric-converted by these respective photodiodes, and these electric charge transfer gates 3 are disposed symmetric with respect to a floating diffusion 4b. The floating diffusions 4a and 4b are connected with each other with use of a metal interconnection or the like.

In the configuration adopted in the present embodiment, the Gr photodiodes and the Gb photodiodes both for green are arranged at regular intervals, and the R photodiodes for red and the B photodiodes for blue are also arranged at regular intervals, while the Gr photodiodes and the Gb photodiodes both for green are arranged at the intervals, which are different from the intervals of the R photodiodes for red and the B photodiodes for blue. In a case of sharing by four pixels in this configuration, the electric charge transfer gates 3 corresponding to the respective photodiodes 2 and the floating diffusions are arranged in the longer intervals out of these different intervals, and these floating diffusions are arranged in a checkered pattern. Due to the floating diffusions arranged in such a checkered pattern, the photodiodes (i, j), (i, j+1), (i+1, j+1), and (i+1, j+2) share one reset transistor and the like, such that the photodiodes are out of alignment by one row between an odd number column and an even number column.

In the layout as described above, there is caused no optical deflection, which has been described as a problem, and the light beams are uniformly incident on the respective photodiodes. As a result, there is generated no horizontal stripe when an image is obtained from the incident signals, thereby realizing a significantly efficient layout of the photodiodes, the electric charge transfer gates, the floating diffusions, the reset transistors, the vertical select transistors, and the amplifier transistors.

Figure 7:
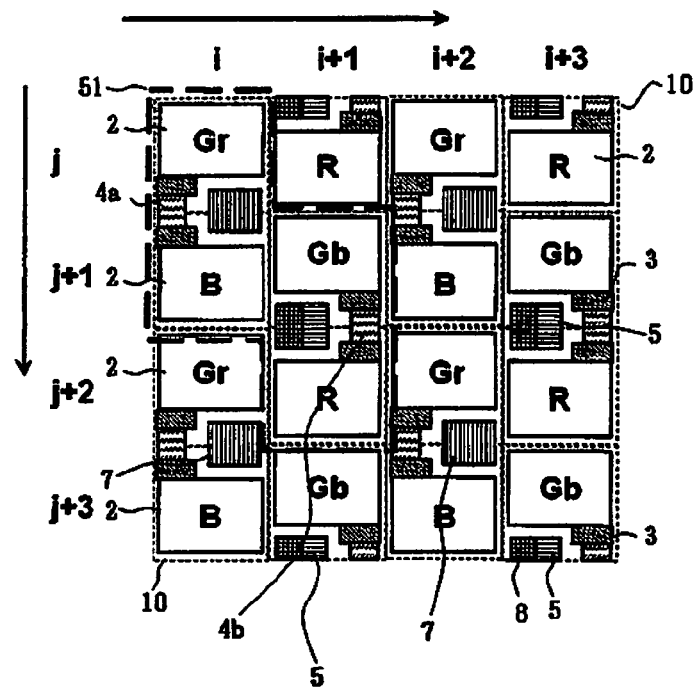
FIG. 7 is a diagram showing a layout of an imaging block in the CMOS image sensor according to the second embodiment, in which one reset transistor, one vertical select transistor, and one amplifier transistor are shared by four photodiodes.

While FIG. 6 shows the case of disposing the amplifier transistor 5 next to the corresponding floating diffusion 4b, there are exerted similar effects also in a case of disposing the amplifier transistor 5 and the vertical select transistor 6 next to the corresponding floating diffusion 4a as shown in FIG. 7.

Figure 8:
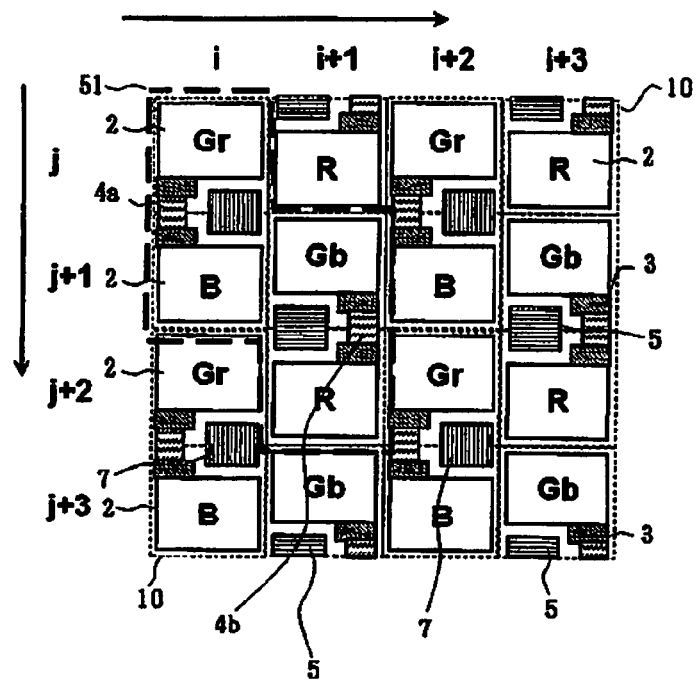
FIG. 8 is a diagram showing a layout of an imaging block in the CMOS image sensor according to the second embodiment, in which one reset transistor and one amplifier transistor are shared by four photodiodes.

In the above configuration exclusive of the select transistors, similar effects are exerted also in the layout shown in FIG. 8 in which the amplifier transistor 5 is disposed next to the corresponding floating diffusion 4a and the reset transistor 7 is disposed next to the corresponding floating diffusion 4b.

Figure 9:
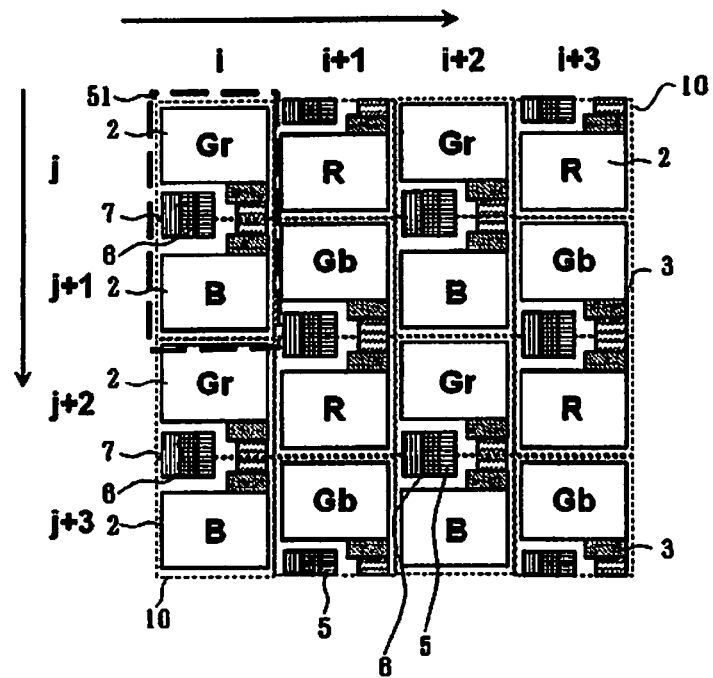
FIG. 9 is a diagram showing a layout of an imaging block in the CMOS image sensor according to the second embodiment, in which one reset transistor, one vertical select transistor, and one amplifier transistor are shared by two photodiodes.

In the second embodiment, there has been mainly described the case where four photodiodes share one reset transistor and one amplifier transistor, which may be alternatively shared by two photodiodes in a similar manner. FIG. 9 shows a layout of a case where two photodiodes share one reset transistor, one amplifier transistor, and one vertical select transistor.

In such a case where the two photodiodes share one reset transistor, one amplifier transistor, and one vertical select transistor, there may be disposed the reset transistor, the amplifier transistor, and the vertical select transistor next to the floating diffusion 4.

Figure 10:
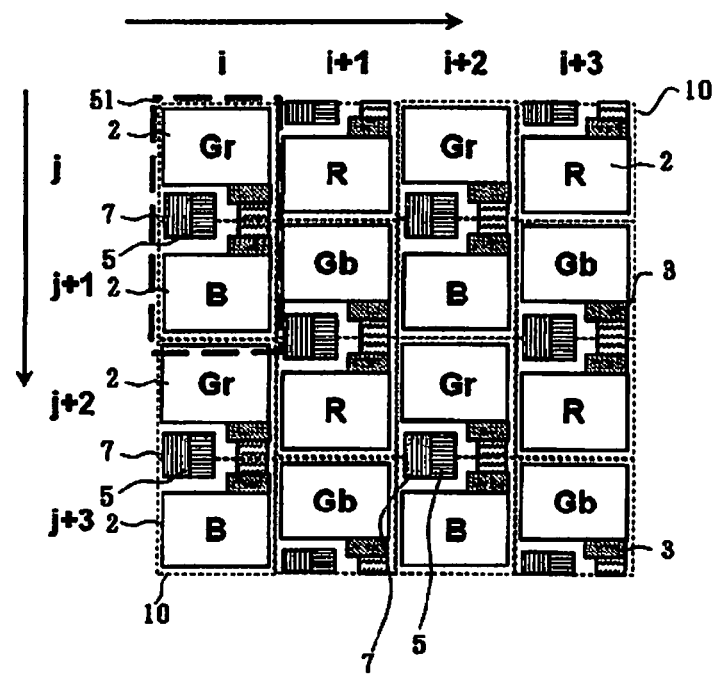
FIG. 10 is a diagram showing a layout of an imaging block in the CMOS image sensor according to the second embodiment, in which one reset transistor and one amplifier transistor are shared by two photodiodes.

FIG. 10 shows a layout of a case where two photodiodes share one reset transistor and one amplifier transistor.

Figure 11:
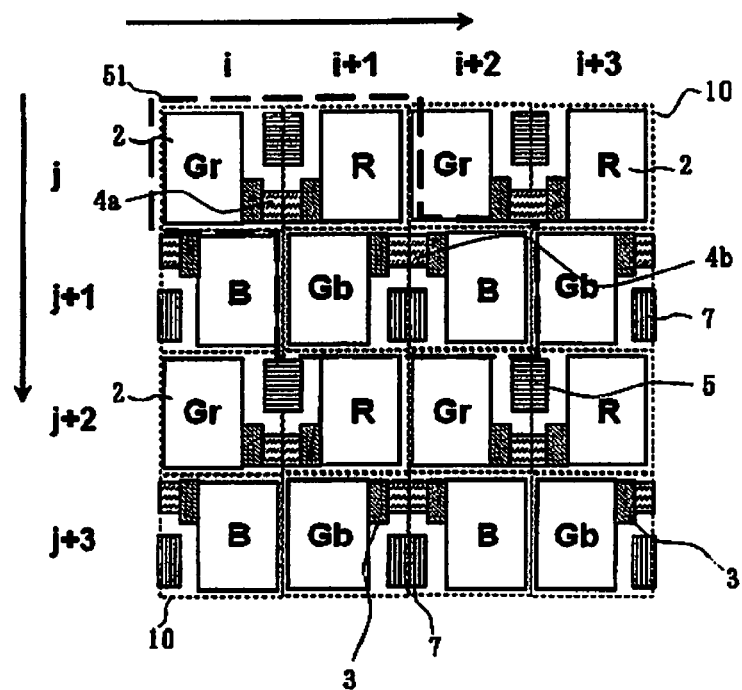
FIG. 11 is a diagram showing a layout of an imaging block in the CMOS image sensor according to the second embodiment, in which one reset transistor, one vertical select transistor, and one amplifier transistor are shared by four photodiodes.

Described with reference to FIGS. 6 through 10 is the case where the photodiodes for green are arranged in the row direction at the intervals different from the intervals of the photodiodes for red and blue. Alternatively, these photodiodes may be arranged in the column direction at different intervals from each other in a similar manner. FIG. 11 shows a layout of a representative case where four photodiodes share one reset transistor, one amplifier transistor, and one vertical select transistor.

In each of FIGS. 6 to 11, the Gr photodiode is disposed at the position (i, j) and the color filters are arranged in the Bayer Array with this Gr photodiode serving as an origin. This origin may be assigned to any one of the B photodiodes, the R photodiodes, the Gr photodiodes, and the Gb photodiodes, in any of which cases there are exerted the effects substantially the same as those of the present invention.

INDUSTRIAL APPLICABILITY

The solid-state image sensor, the method of manufacture thereof, and the imaging device according to the present invention may be applied to a CMOS image sensor, an electronic camera, or the like, and contribute to reduction in size and increase in the number of pixels of the CMOS image sensor as well as prevention of deterioration in imaging properties such as the quantity of saturation signals and sensitivity. Further, the solid-state imaging device according to the present invention may be widely utilized in a camera or a camera system for a digital still camera, a mobile camera, a camera for medical use, a vehicle camera, a video camera, a monitoring camera, a security camera, or the like, which concerns high image quality.

The invention claimed is:

1. A solid-state imaging device comprising on a semiconductor substrate:
   a plurality of photodiodes, disposed in a matrix (i, j), for converting light beams into signal charges and accumulating the signal charges;
   an electric charge transfer gate for reading out the signal charges accumulated in the photodiodes;
   a floating diffusion for converting into electric potentials the signal charges that are photoelectric-converted by the photodiodes and are read out by the electric charge transfer gate;
   a reset transistor for resetting the signal charges; and an amplifier transistor for amplifying the read out signal charges,
   the reset transistor and the amplifier transistor being shared by the plurality of photodiodes, wherein
   at least one of the reset transistor and the amplifier transistor is disposed in a clearance portion among the plurality of photodiodes sharing the reset transistor and the amplifier transistor,
   a distance between a centroid of a light sensing area of a first photodiode (i, j) included in the plurality of photodiodes and a centroid of a light sensing area of a second photodiode (i, j+1) included in the plurality of photodiodes is different from a distance between a centroid of a light sensing area of a photodiode (i+1, j) included in the plurality of photodiodes and a centroid of a light sensing area of a photodiode (i+1, j+1) included in the plurality of photodiodes, one of the reset transistor and the amplifier transistor is disposed between the first photodiode (i, j) and the second photodiode (i, j+1) in a common region in which the reset transistor and the amplifier transistor are shared, and another one of the reset transistor and the amplifier transistor, not disposed between the first photodiode (i, j) and the second photodiode (i, j+1), is disposed between a third photodiode (i+1, j+n) and a fourth photodiode (i+1, j+n+1), where n being +1.

2. The solid-state imaging device according to claim 1, wherein the floating diffusion for converting the signal charges to electric potentials is disposed in the boundary portion between the two photodiodes disposed in the longer one of the distance between the centroid of the light sensing area of the photodiode (i, j) and the centroid of the light sensing area of the photodiode (i, j+1), and the distance between the centroid of the light sensing area of the photodiode (i+1, j) and the centroid of the light sensing area of the photodiode (i+1, j+1), or disposed in the boundary portion between the two photodiodes disposed in the longer one of the distance between the centroid of the light sensing area of the photodiode (i, j) and the centroid of the light sensing area of the photodiode (i+1, j), and the distance between the centroid of the light sensing area of the photodiode (i, j+1) and the centroid of the light sensing area of the photodiode (i+1, j+1), and the floating diffusion for converting the signal charges to electric potentials is neither disposed in the boundary portion between the two photodiodes disposed in the shorter one of the distance between the centroid of the light sensing area of the photodiode (i, j) and the centroid of the light sensing area of the photodiode (i, j+1), and the distance between the centroid of the light sensing area of the photodiode (i+1, j) and the centroid of the light sensing area of the photodiode (i+1, j+1), nor disposed in the boundary portion between the two photodiodes disposed in the shorter one of the distance between the centroid of the light sensing area of the photodiode (i, j) and the centroid of the light sensing area of the photodiode (i+1, j), and the distance between the centroid of the light sensing area of the photodiode (i, j+1) and the centroid of the light sensing area of the photodiode (i+1, j+1).

3. A solid-state imaging device comprising on a semiconductor substrate:
a plurality of photodiodes, disposed in a matrix (i, j), for converting light beams into signal charges and accumulating the signal charges;
an electric charge transfer gate for reading out the signal charges accumulated in the photodiodes;
a floating diffusion for converting into electric potentials the signal charges that are photoelectric-converted by the photodiodes and are read out by the electric charge transfer gate;
a reset transistor for resetting the signal charges; and an amplifier transistor for amplifying the read out signal charges,
the reset transistor and the amplifier transistor being shared by the plurality of photodiodes, wherein
at least one of the reset transistor and the amplifier transistor is disposed in a clearance portion among the plurality of photodiodes sharing the reset transistor and the amplifier transistor, a distance between a centroid of a light sensing area of a first photodiode (i, j) included in the plurality of photodiodes and a centroid of a light sensing area of a second photodiode (i+1, j) included in the plurality of photodiodes is different from a distance between a centroid of a light sensing area of a photodiode (i, j+1) included in the plurality of photodiodes and a centroid of a light sensing area of a photodiode (i+1, j+1) included in the plurality of photodiodes, one of the reset transistor and the amplifier transistor is disposed between the first photodiode (i, j) and the second photodiode (i+1, j) in a common region in which the reset transistor and the amplifier transistor are shared, another one of the reset transistor and the amplifier transistor, not disposed between the first photodiode (i, j) and the second photodiode (i+1, j), is disposed between a third photodiode (i+1, j+1) and a fourth photodiode (i+n+1, j+1), where n being +1.

4. A solid-state imaging device comprising on a semiconductor substrate:
a plurality of photodiodes, disposed in a matrix (i, j), for converting light beams into signal charges and accumulating the signal charges;
an electric charge transfer gate for reading out the signal charges accumulated in the photodiodes;
a floating diffusion for converting into electric potentials the signal charges that are photoelectric-converted by the photodiodes and are read out by the electric charge transfer gate;
a reset transistor for resetting the signal charges; and
an amplifier transistor for amplifying the read out signal charges,
the reset transistor and the amplifier transistor being shared by the plurality of photodiodes, wherein
at least one of the reset transistor and the amplifier transistor is disposed in a clearance portion among the plurality of photodiodes sharing the reset transistor and the amplifier transistor,
a distance between a centroid of a light sensing area of a photodiode (i, j) included in the plurality of photodiodes and a centroid of a light sensing area of a photodiode (i, j+1) included in the plurality of photodiodes is different from a distance between a centroid of a light sensing area of a photodiode (i+1, j) included in the plurality of photodiodes and a centroid of a light sensing area of a photodiode (i+1, j+1) included in the plurality of photodiodes, or a distance between a centroid of a light sensing area of a photodiode (i, j) included in the plurality of photodiodes and a centroid of a light sensing area of a photodiode (i+1, j) included in the plurality of photodiodes is different from a distance between a centroid of a light sensing area of a photodiode (i, j+1) included in the plurality of photodiodes and a centroid of a light sensing area of a photodiode (i+1, j+1) included in the plurality of photodiodes,
two adjacent and paired photodiodes, included in the photodiodes, share the floating diffusion, and
a plurality of floating diffusions each configured identically with the shared floating diffusion are disposed every other row in a row direction and every other column in a column direction so as to form a checkered pattern.

5. The solid-state imaging device according to claim 4, wherein the plurality of photodiodes are (n+1) photodiodes, and the (n+1) photodiodes are either photodiodes (i, j), (i, j+1), . . . , and (i, j+n), or photodiodes (i, j), (i+1, j), . . . , and (i+n, j), and the (n+1) photodiodes share the reset transistor and the amplifier transistor, and n is a natural number greater than or equal to one.

6. The solid-state imaging device according to claim 4, wherein the plurality of photodiodes are (2+2×n) photodiodes, and the (2+2×n) photodiodes are either photodiodes (i, j), (i, j+1), . . . , (i, j+n), (i+1, j+1), (i+1, j+1+1), . . . , and (i+1, j+1+n), or photodiodes (i, j), (i+1, j), . . . , (i+n, j), (i+1, j+1), (i+1+1, j+1), . . . , and (i+1+n, j+1), and the (2+2×n) photodiodes share the reset transistor and the amplifier transistor, and n is a natural number greater than or equal to one.

7. The solid-state imaging device according to claim 4, wherein
one of the reset transistor, the amplifier transistor, and a vertical select transistor is disposed in a boundary portion between two photodiodes disposed in a longer one of the distance between the centroid of the light sensing area of the photodiode (i, j) and the centroid of the light sensing area of the photodiode (i, j+1), and the distance between the centroid of the light sensing area of the photodiode (1+1, j) and the centroid of the light sensing area of the photodiode (i+1, j+1), or disposed in a boundary portion between two photodiodes disposed in a longer one of the distance between the centroid of the light sensing area of the photodiode (i, j) and the centroid of the light sensing area of the photodiode (i+1, j), and the distance between the centroid of the light sensing area of the photodiode (i, j+1) and the centroid of the light sensing area of the photodiode (i+1, j+1), and
the reset transistor, the amplifier transistor, and the vertical select transistor are neither disposed in a boundary portion between two photodiodes disposed in a shorter one of the distance between the centroid of the light sensing area of the photodiode (i, j) and the centroid of the light sensing area of the photodiode (i, j+1), and the distance between the centroid of the light sensing area of the photodiode (i+1, j) and the centroid of the light sensing area of the photodiode (i+1, j+1), nor disposed in a boundary portion between two photodiodes disposed in a shorter one of the distance between the centroid of the light sensing area of the photodiode (i, j) and the centroid of the light sensing area of the photodiode (i+1, j), and the distance between the centroid of the light sensing area of the photodiode (i, j+1) and the centroid of the light sensing area of the photodiode (i+1, j+1).

8. A solid-state imaging device comprising on a semiconductor substrate:
a plurality of photodiodes, disposed in a matrix (i, j), for converting light beams into signal charges and accumulating the signal charges;
an electric charge transfer gate for reading out the signal charges accumulated in the photodiodes;
a floating diffusion for converting into electric potentials the signal charges that are photoelectric-converted by the photodiodes and are read out by the electric charge transfer gate;
a reset transistor for resetting the signal charges; and
an amplifier transistor for amplifying the read out signal charges,
the reset transistor and the amplifier transistor being shared by the plurality of photodiodes, wherein
at least one of the reset transistor and the amplifier transistor is disposed in a clearance portion among the plurality of photodiodes sharing the reset transistor and the amplifier transistor,
a distance between a centroid of a light sensing area of a photodiode (i, j) included in the plurality of photodiodes and a centroid of a light sensing area of a photodiode (i, j+1) included in the plurality of photodiodes is different from a distance between a centroid of a light sensing area of a photodiode (i+1, j) included in the plurality of photodiodes and a centroid of a light sensing area of a photodiode (i+1, j+1) included in the plurality of photodiodes, or a distance between a centroid of a light sensing area of a photodiode (i, j) included in the plurality of photodiodes and a centroid of a light sensing area of a photodiode (1+1, j) included in the plurality of photodiodes is different from a distance between a centroid of a light sensing area of a photodiode (i, j+1) included in the plurality of photodiodes and a centroid of a light sensing area of a photodiode (i+1, j+1) included in the plurality of photodiodes,
a color filter is disposed such that the photodiode (i, j), the photodiode (i, j+1), the photodiode (i+1, j), and the photodiode (i+1, j+1) perform photoelectric conversion of a light beam of a first color, a light beam of a second color, a light beam of a third color, and a light beam of the first color, respectively,
centroids of light sensing areas of the photodiodes each for photoelectric-converting a light beam of the first color are arranged at substantially regular intervals along a row direction and a column direction, and
centroids of light sensing areas of the photodiodes each for photoelectric-converting a light beam of one of the second and third colors are arranged at substantially regular intervals along the row direction and the column direction.

9. The solid-state imaging device according to claim 8, wherein the color filter is a filter for three primary colors of green, red, and blue, and the first color, the second color, and the third color are green, red, and blue, respectively, or the first color, the second color, and the third color are green, blue, and red, respectively.

10. The solid-state imaging device according to claim 8, wherein the color fitter is a filter for complementary colors including green, magenta, yellow, and cyan, and the first color is one of green and magenta, the second color is yellow, and the third color is cyan, or the first color is one of green and magenta, the second color is cyan, and the third color is yellow.

* * * * *